United States Patent
Zeller et al.

(10) Patent No.: US 12,198,232 B2
(45) Date of Patent: Jan. 14, 2025

(54) METHOD FOR ACQUIRING AN MR-IMAGE DATASET OF AT LEAST TWO SLICES BY MEANS OF SIMULTANEOUS MULTISLICE EXCITATION

(71) Applicant: Siemens Healthcare GmbH, Erlangen (DE)

(72) Inventors: Mario Zeller, Erlangen (DE); Dominik Paul, Bubenreuth (DE); Wei Liu, Shenzhen (CN)

(73) Assignee: SIEMENS HEALTHINEERS AG, Forchheim (DE)

( * ) Notice: Subject to any disclaimer, the term of this patent is extended or adjusted under 35 U.S.C. 154(b) by 525 days.

(21) Appl. No.: 17/501,213

(22) Filed: Oct. 14, 2021

(65) Prior Publication Data
US 2022/0130080 A1    Apr. 28, 2022

(30) Foreign Application Priority Data
Oct. 22, 2020 (CN) .......................... 202011137507.3

(51) Int. Cl.
*G06T 11/00* (2006.01)
*G06T 3/60* (2006.01)
*G06T 7/30* (2017.01)

(52) U.S. Cl.
CPC .............. *G06T 11/005* (2013.01); *G06T 3/60* (2013.01); *G06T 7/30* (2017.01); *G06T 2207/10088* (2013.01)

(58) Field of Classification Search
None
See application file for complete search history.

(56) References Cited

U.S. PATENT DOCUMENTS

| 10,557,903 B2 | 2/2020 | Carinci et al. |
| 2015/0260820 A1* | 9/2015 | Speier ................ G01R 33/4835 324/309 |
| 2019/0154785 A1 | 5/2019 | Zhou et al. |

OTHER PUBLICATIONS

SETSOMPOP, Kawin et al.: "Blipped-Controlled Aliasing in Parallel Imaging for Simultaneous Multislice Echo Planar Imaging with Reduced g-Factor Penalty"; in: Magnetic Resonance in Medicine; vol. 67; pp. 1210-1224; 2012.
(Continued)

*Primary Examiner* — Vincent Rudolph
*Assistant Examiner* — Nicholas Crespo Stazer
(74) *Attorney, Agent, or Firm* — Harness, Dickey & Pierce, P.L.C.

(57) ABSTRACT

A method is for acquiring a magnetic resonance (MR) image dataset of at least two slices via simultaneous multi-slice excitation. An embodiment of the method includes executing an MR imaging sequence using multi-band radio-frequency excitation pulses to excite the at least two slices simultaneously in at least two repetitions, the repetitions each being executed according to a phase modulation scheme in which each of the simultaneously excited slices is assigned a phase and the phase of at least one of the simultaneously excited slices is changed from one repetition to the next, thereby acquiring an MR dataset of a collapsed image in each repetition; performing a spatial registration between the at least two collapsed images and performing motion correction on at least one of the MR datasets of the collapsed images; and reconstructing MR images of the at least two slices from the corrected MR datasets of the collapsed images.

22 Claims, 5 Drawing Sheets

(56) References Cited

OTHER PUBLICATIONS

Wyawahare M.V. et al: "Image Registration Technique: An overview", International Journal of Signal Processing, Image Processing and Pattern Recognition, vol. 2, No. 3, Sep. 2009.

Pluim et al. "Mutual-information-based registration of medical images": a survey. IEEE Transactions on Medical Imaging 22, 986-1004.

Wu, Zhaotao et al: "Inter-slice image augmentation based on frame interpolation for boosting medical image segmentation accuracy"; arXiv:2001.11698v1, Jan. 31, 2020.

Hamilton J. at al.: "Recent Advances in Parallel Imaging for MRI", Prog. Nucl. Magn. Reson. Spectrosc: 101: 71-95 (2017).

Souza, S. P. et al. "SIMA: Simultaneous Multislice Acquisition of MR Images by Hadamard-Encoded Excitation" Journal of Computer Assisted Tomography, vol. 12, No. 6, pp. 1026-1030, 1988; 1988.

Nencka, Andrew S. et al.: "Auto-calibrated multiband imaging"; International Society for Magnetic Resonance in Medicine; ISMRM; 2030 Addison Street, 7th Floor; Berkeley, CA 94704 USA; No. 22; p. 4398; Apr. 28, 2014; XP040671171; 2014.

Smith, Stephen M. et al: "Resting-state fMRI in the Human Connectome Project"; NEUROIMAGE; vol. 80; May 20, 2013; pp. 144-168; XP028678526; ISSN: 1053-8119; DOI: 10.1016/J.NEUROIMAGE.2013.05.039; 2013.

Nencka, Andrew S. et al.: "Simultaneous Multislice Acquisition to Avoid Motion Artifacts in Challenging Patient Populations"; International Society for Magnetic Resonance in Medicine; ISMRM; 2030 Addison Street, 7th Floor; Berkeley, CA 94704 USA; No. 23; p. 2054; May 15, 2015; XP040667731; 2015.

\* cited by examiner

METHOD FOR ACQUIRING AN MR-IMAGE DATASET OF AT LEAST TWO SLICES BY MEANS OF SIMULTANEOUS MULTISLICE EXCITATION

PRIORITY STATEMENT

The present application hereby claims priority under 35 U.S.C. § 119 to Chinese patent application number CN 202011137507.3 filed Oct. 22, 2020, the entire contents of which are hereby incorporated herein by reference.

FIELD

Example embodiments of the invention generally relate to a method for acquiring a magnetic resonance (MR) image dataset of at least two slices by means of simultaneous multislice excitation, a magnetic resonance apparatus and a non-transitory computer-readable data storage medium.

BACKGROUND

Magnetic resonance imaging (MRI) is an important imaging modality in modern medicine and biology. However, its main drawbacks are the long scan time needed to spatially encode the signal, as well as the relatively low signal-to-noise ratio, especially for low-field systems operating at <1T, for example 0.5T. Hadamard-encoded simultaneous multislice (SMS) imaging has been proposed by Souza et al. (Souza S. P., Szumowski J.: "SIMA: Simultaneous multislice acquisition of MR images by Hadamard-encoded excitation" J. Comput. Assist. Tomogr. 12(6): 1026-1030 (1988)) and is currently experiencing a revival for low-field MRI-systems. SMS imaging generally requires slice-selective excitation of two or more slices simultaneously, which is possible by means of multi-band radio-frequency (RF) excitation pulses. The superposed signals from the two or more slices can be disentangled by phase manipulation of the signal, when using a phase modulation scheme such as Hadamard-encoding, the imaging sequence must be repeated N-times in order to disentangle the signals from N-slices, but with a different phase pattern for each excited slice. The use of such add/subtract schemes as described here below make the imaging method vulnerable to the effects of motion, since the signal for each slice is obtained from several repetitions. However, compared to the recently introduced slice-GRAPPA-based simultaneous multislice imaging method (Setsompop K., Gagoski B. A. et al.: "Blipped-Controlled Aliasing in Parallel Imaging for Simultaneous Multislice Echo Planar Imaging with Reduced g-factor Penalty" Magnetic Resonance in Medicine 67: 1210-1224 (2012)), Hadamard-encoded SMS imaging can be carried out with single channel RF-coils, whereas slice-GRAPPA-methods make use of the different sensitivity profile of the various individual coil in a multi-channel RF-coil.

SUMMARY

At least one embodiment of the present invention provides a multislice imaging method, which is robust and provides an improved image quality, even in low-field MRI-systems, and under difficult imaging conditions.

At least one embodiment is directed to a method for acquiring a MR-image dataset of at least two slices via simultaneous multislice excitations, comprising:

a) executing an MR imaging sequence using multi-band radio-frequency (RF) excitation pulses to excite the at least two slices simultaneously, wherein the MR imaging sequence includes at least two repetitions, wherein the repetitions are executed according to a phase modulation scheme, in which each of the simultaneously excited slices is assigned a phase in each repetition, and the phase of at least one of the simultaneously excited slices is changed from one repetition to the next, thereby acquiring an MR dataset of a collapsed image in each repetition;

b) performing a spatial registration between the at least two collapsed images and thereby obtaining translational and/or rotational correction parameters;

c) performing motion correction on at least one of the MR datasets of the collapsed images based on the correction parameters, thereby obtaining corrected MR datasets; and d) reconstructing MR images of the at least two slices from the corrected MR datasets of the collapsed images.

At least one embodiment is directed to an MR apparatus adapted to carry out the method of an embodiment, as well as a computer-readable data storage medium encoded with programming instructions to carry out the method of an embodiment. Any features described with regard to the method are also applicable to the MR apparatus and data storage medium and vice versa.

An embodiment of the invention is further directed to a magnetic resonance (MR) apparatus, comprising a) an MR scanner adapted to acquire MR datasets from a subject disposed inside the MR scanner, and b) a computer configured to emit control signals to the MR scanner in order to cause the MR scanner to perform the method according to any one of the preceding claims. The MR scanner may be any commercially available MR scanner, in particular a low-field scanner. The MR scanner includes all the usual equipment, in particular a main magnet, gradient coils as well as an RF coil for radiating RF excitation pulses and receiving MR signals. The RF coil may comprise a coil array. The MR scanner is connected to a computer configured to emitted control signals. The computer may be part of the console, from which the MR scanner is controlled. The computer may be any calculating device, such as a laptop, PC, workstation, cloud computer or mobile device.

An embodiment of the invention is further directed to a computer program product comprising programming instructions, which are adapted to be loaded into a computer of a MS apparatus that comprises an MR scanner, wherein the programming instructions cause the computer to carry out an embodiment of the inventive method.

According to a further embodiment of the invention, a non-transitory computer-readable data storage medium encoded with programming instructions adapted to be loaded into a computer of a magnetic resonance (MR) apparatus that comprises an MR scanner, the programming instructions causing the computer to carry out an embodiment of the inventive method in conjunction with the MR scanner by emitting control signals to the MR scanner and receiving data from the MR scanner. The storage medium may be in the cloud or may be any digital data storage medium, such as a CD-ROM, hard disc, SD-card, SSD-card, USB-card, etc.

At least one embodiment is directed to a method for acquiring a magnetic resonance (MR) image dataset of at least two slices via simultaneous multi-slice excitation, the method comprising:

a) executing an MR imaging sequence using multi-band radio-frequency excitation pulses to excite the at least two slices simultaneously, wherein the MR imaging sequence includes at least two repetitions, wherein the at least two repetitions are executed according to a phase modulation scheme in which each excited slice of the at least two simultaneously excited slices is assigned a phase in each respective repetition of the at least two repetitions, and a phase of at least one of the at least two simultaneously excited slices is changed from one respective repetition to a next respective repetition, to acquire a respective MR dataset of a respective collapsed image in each respective repetition;

b) performing a spatial registration between at least two collapsed images to obtain at least one of translational and rotational correction parameters;

c) performing motion correction on at least one of the MR datasets of the at least two collapsed images based on the at least one of translational and rotational correction parameters, to obtain corrected MR datasets; and d) reconstructing MR images of the at least two slices from the corrected MR datasets of the collapsed images.

At least one embodiment is directed to a magnetic resonance apparatus, comprising:

an MR scanner adapted to acquire MR datasets from a subject disposed inside the MR scanner; and a computer configured to emit control signals to the MR scanner to cause the MR scanner to perform at least:

a) executing an MR imaging sequence using multi-band radio-frequency excitation pulses to excite the at least two slices simultaneously, wherein the MR imaging sequence includes at least two repetitions, wherein the at least two repetitions are executed according to a phase modulation scheme in which each excited slice of the at least two simultaneously excited slices is assigned a phase in each respective repetition of the at least two repetitions, and a phase of at least one of the at least two simultaneously excited slices is changed from one respective repetition to a next respective repetition, to acquire a respective MR dataset of a respective collapsed image in each respective repetition;

b) performing a spatial registration between at least two collapsed images to obtain at least one of translational and rotational correction parameters;

c) performing motion correction on at least one of the MR datasets of the at least two collapsed images based on the at least one of translational and rotational correction parameters, to obtain corrected MR datasets; and d) reconstructing MR images of the at least two slices from the corrected MR datasets of the collapsed images.

At least one embodiment is directed to a non-transitory computer-readable data storage medium encoded with programming instructions, adapted to be loaded into a computer of a magnetic resonance apparatus comprising an MR scanner, the programming instructions causing, when executed, the computer to carry out the method of an embodiment in conjunction with the MR scanner by emitting control signals to the MR scanner and receiving data from the MR scanner.

BRIEF DESCRIPTION OF THE DRAWINGS

Embodiments of the invention shall now be described with reference to the attached drawings, in which.

DETAILED DESCRIPTION OF THE EXAMPLE EMBODIMENTS

Figure 1:
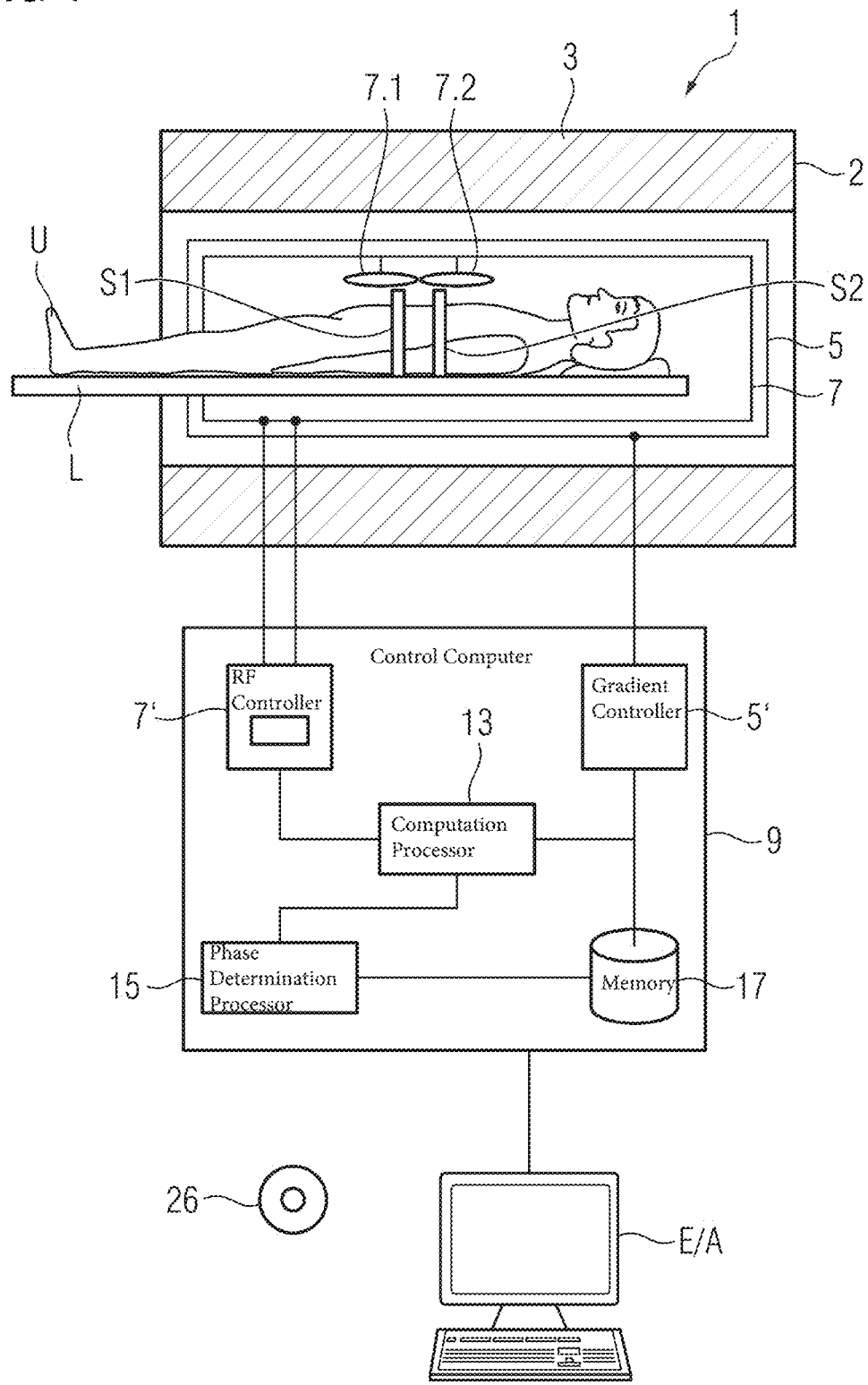
FIG. 1 is a schematic representation of a magnetic resonance apparatus according to an embodiment of the invention.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. At least one embodiment of the present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without subdividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

At least one embodiment is directed to a method for acquiring a MR-image dataset of at least two slices via simultaneous multislice excitations, comprising:
- a) executing an MR imaging sequence using multi-band radio-frequency (RF) excitation pulses to excite the at least two slices simultaneously, wherein the MR imaging sequence includes at least two repetitions, wherein the repetitions are executed according to a phase modulation scheme, in which each of the simultaneously excited slices is assigned a phase in each repetition, and the phase of at least one of the simultaneously excited slices is changed from one repetition to the next, thereby acquiring an MR dataset of a collapsed image in each repetition;
- b) performing a spatial registration between the at least two collapsed images and thereby obtaining translational and/or rotational correction parameters;
- c) performing motion correction on at least one of the MR datasets of the collapsed images based on the correction parameters, thereby obtaining corrected MR datasets; and
- d) reconstructing MR images of the at least two slices from the corrected MR datasets of the collapsed images.

At least one embodiment is directed to an MR apparatus adapted to carry out the method of an embodiment, as well as a computer-readable data storage medium encoded with programming instructions to carry out the method of an embodiment. Any features described with regard to the method are also applicable to the MR apparatus and data storage medium and vice versa.

At least one embodiment of the invention proposes to incorporate a motion correction into a simultaneous multi-slice (SMS) imaging method. Such SMS imaging relies on the repeated execution of an MR imaging sequence, using multi-band RF excitation pulses to excite the at least two slices simultaneously. The repetitions are executed according to a phase modulation scheme, in which each of the simultaneously excited slices is assigned a phase in each repetition and the phase of at least one of the slices is changed from one repetition to the next. In each repetition, an MR dataset, comprising the superposed signals from the two or more slices is acquired, wherein the corresponding MR dataset (in image space or k-space) is termed "collapsed image", since the image data from the two or more slices are superposed onto one another. During SMS reconstruction of the MR images of the individual slices, the signals from the individual slices are separated from each other from the motion-corrected MR datasets of the collapsed images with the use of e. g. parallel acquisition reconstruction techniques, also referred to as slice multiplexing.

The idea of at least one embodiment of the invention is to perform a spatial registration of the collapsed slices between each required repetition, prior to the SMS reconstruction. The method is illustrated for two repetitions and two simultaneously acquired slices, but evidently also works for three or more repetitions/slices. The two or more slices excited simultaneously preferably do not overlap, although the method is also applicable to overlapping slices. The imaging method may comprise several iterations of the method steps a to d, preferably with further simultaneously excited slices, in order to cover a full volume to be imaged.

A multi-band RF-pulse is any pulse used to excite or otherwise manipulate, for example to refocus or saturate, two or more slices simultaneously. Such a multi-band RF-pulse may be a multiplex (superposition) of individual RF-pulses, which would be used to manipulate the single slices individually. In order to be able to separate the signals acquired from the individual slices, a phase is assigned to each of the simultaneously excited slices. The phases can be assigned, for example, by manipulation of the phases of the multi-band RF-excitation pulses used, in particular, of the individual RF-pulses of which they are composed, or alternatively by additional gradients to be switched. In a preferred embodiment, the multi-band RF-pulse used in each repetition are multiplexed according to the phase modulation scheme from the added pulse forms of such individual RF-pulses. Preferably, the phase modulation scheme is predetermined for each SMS imaging session, and is determined e. g. by the number of slices to be imaged in total and in each repetition.

Spatial encoding of the acquired MR signals may be achieved by standard gradient switching in two directions, for example in read-direction and phase-encoding direction (two-dimensional gradient encoding). The resulting MR-signals may be acquired using a single-channel or multi-channel RF-coil, such that the signals from all excited slices are collapsed in one k-space dataset.

The spatial registration between the collapsed images is performed to obtain at least transformational and/or rotational correction parameters, in order to correct for a translation or rotation of the object to be imaged which has taken place in-between the repetitions required for SMS imaging. The spatial registration and motion correction may be performed by a method as described in the article by M. V. Wyawahare: "Image Registration Technique: An overview", International Journal of Signal Processing, Image Processing and Pattern Recognition, Vol. 2, No. 3, September 2009, the entire contents of which are hereby incorporated herein by reference.

Generally, the spatial registration and motion correction may comprise the following steps:

Feature detection, wherein distinctive image features, such as closed-boundary regions, edges, contours, line intersections, corners, etc. are detected in the images to be registered with one another.

Feature matching: the correspondence between the features in the two or more images is established.

Transfer model estimation: the type and parameters of the so-called mapping functions, which align one image with another image (e. g. the sensed image with a reference image), are estimated. These mapping functions are also referred to herein as correction parameters, in particular translational and/or rotational correction parameters.

Image resampling and transformation: One of the images (e. g. the sensed image) is transformed via the mapping functions, thereby performing the actual motion correction and obtaining a corrected set of images. Generally, this requires image resampling, wherein the pixel values are resampled e. g. by interpolation onto the new pixel positions.

According to an embodiment of the invention, the spatial registration is performed via a registration method which is insensitive to contrast changes, in particular, a mutual information-based method, as described in the article by Wyawahare, the entire contents of which are hereby incorporated herein by reference. Mutual information-based registration begins with the estimation of the joint probability of the intensities of corresponding voxels in the two images. Mutual information can be used to parameterize and solve the correspondence problem in feature-based registration. The advantage of this method is that it is insensitive to image contrasts, which may vary strongly in-between the collapsed MR-datasets, because of the different pulse superposition. Mutual information may be maximized using gradient decent optimization methods or other. A review of mutual information-based image registration methods can be found in J. Pluim et al. "Mutual information-based registration of medical images: A survey" IEEE Transactions on Medical Imaging, Vol. 22 (8), 986-1004 (2003), the entire contents of which are hereby incorporated herein by reference.

According to a preferred embodiment, the registration of the collapsed images with one another is performed in image space (rather than in k-space). Thus, the MR-datasets of the collapsed images are preferably first reconstructed, wherein the reconstruction comprises a Fourier transform to obtain an image from the signals acquired in k-space. The further steps, i. e. performing motion correction and reconstructing the individual images may performed either in k-space or in image space, as described herein below.

According to an embodiment, the motion correction includes a translation and/or a rotation in image space. Thus, the translational and/or rotational correction parameters obtained in the spatial registration may comprise a translational vector and/or a rotational transform. Alternatively, the motion correction may also be performed in k-space, wherein a translational transform corresponds to a multiplication with a phase ramp, and a rotation in image space corresponds to a rotation in k-space.

According to an embodiment, the motion correction comprises rigid-in plane motion correction within the plane of one or more of the at least two slices. The most straightforward variant is to correct for rigid-in plane motion only, the easiest variant comprising translation only. As mentioned above, these effects may be corrected by translation/rotation in image space or multiplication with phase ramps/rotation in k-space. Since an important application of SMS (in particular Hadamard) imaging is brain or joint imaging, this assumption is often reasonable.

In a further embodiment, the motion correction may also comprise an elastic motion correction. In this case, the correction parameters comprise a motion vector field. According to a more advanced embodiment, through-plane motion/rotation may be considered as well. This may be performed by registration of collapsed imaged acquired from different pairs of slices, and performing signal interpolation between these collapsed images utilizing e.g. a cubic spline interpolation in image space or applying a Fourier Transform along slice direction, adding a linear phase ramp and applying an inverse Fourier transform to obtain intermediate slices. Convolutional neural network based methods such as described by Wu et al. "Inter-slice image augmentation based on frame interpolation for boosting medical image segmentation accuracy" (2020) could be utilized as well, the entire contents of which are hereby incorporated herein by reference.

Through plane motion correction is possible in particular when the motion is not independent between the different slices, but for example comprising a dependent motion through the slices, for example a dilatation and/or contraction of the object, such as may be caused by breathing. Motion correction, even through-plane and/or elastic motion correction, may thus be possible in certain situations in which the motion vector field in both simultaneously acquired slices is similar.

According to an embodiment, the multiband radio-frequency (RF) excitation pulses each comprise a first and second single-band pulse shape, wherein at least one single-band pulse shape is phase shifted between one repetition and the next. The phase shift is determined by the phase modulation scheme.

Alternatively, the phases assigned to the simultaneously excited slices is varied from one repetition to the next by switching additional gradients in slice direction, as described for example in the above-mentioned paper by Setsompop et al, the entire contents of which are hereby incorporated herein by reference. Accordingly, the phases assigned to the simultaneously excited slices may be imparted either by the RF excitation, or by gradients or gradient blips in slice direction that are switched so as to add the desired phase to the spins from the various simultaneously excited slices. The way the phase is realised in the two or more simultaneously excited slices may be independent from the phase modulation scheme used.

According to an embodiment, the phase modulation scheme uses Hadamard encoding, as described by S. B. Souza et al, the entire contents of which are hereby incorporated herein by reference. Therein, the phase of each slice excitation frequency is modulated in a binary pattern, such as that given by the Hadamard matrix of dimension equal to the number of slices. All repetitions are used to reconstruct each slice. This technique is particularly well sorted to a moderate number of slices, e.g. 2-16. The Hadamard matrix is its own invers, so that the Hadamard transform is defined for any positive integral of order N. For example, in case of N=2, the Hadamard matrix is $$\begin{bmatrix} 1 & 1 \\ 1 & -1 \end{bmatrix} \quad (1)$$

Addition of the collapsed images acquired in the two repetitions will thus result in an image of the first slice. Subtraction of the two collapsed images from one another will result in an image of the second slice. This principle can be extended to larger number of slices, for example with N=4, the corresponding excitation matrix is $$\begin{bmatrix} 1 & 1 & 1 & 1 \\ 1 & -1 & -1 & 1 \\ -1 & -1 & 1 & 1 \\ -1 & 1 & -1 & 1 \end{bmatrix} \quad (2)$$

Although this process is closely related to the Fourier transform, a distinction must be made between this technique and existing 3D-FT (three-dimensional Fourier Transform) methods. In Hadamard encoding, spatial encoding in the third dimension (slice direction) is accomplished by phase modulating the excitation envelope in discrete steps of n, rather than by adding a phase-encoding magnetic field gradient pulse. Thereby, it is not necessary that the slices be equidistant. Rather, arbitrary slice placement is by appropriate choice of the phase modulation patterns.

However, at least one embodiment of the invention can also be applied to other SMS averaging methods, e.g. as described in U.S. Pat. No. 10,557,903 B2, the entire contents of which are hereby incorporated herein by reference. This slice multiplexing method follows a similar approach utilizing several repetitions with varying CAIPIRINHA blip patterns to obtain a fully sampled three-dimensional (3D) k-space either for direct Fourier reconstruction or for calibration of slice or in-plane GRAPPA kernels without separate reference scans. Accordingly, the method for the invention may also be applied to slice multiplexing methods, in which the k-space in slice direction is undersampled. This requires at least two RF-reception coils, preferably with different sensitivity profiles in slice direction. In fact, the method of the invention is applicable to any slice multiplexing method in which a number of N-slices is simultaneously acquired using M repetitions, wherein N>=2 and M>=2, but wherein N is not necessary equal to M. For Hadamard encoding, N=M, but when techniques such as slice-GRAPPA or other parallel imaging methods are used, the number of slices N may also be higher than the number M of repetitions.

The MR-imaging sequences used to acquire the collapsed images may be any MR-imaging sequence, for example a spin-echo or turbo-spin-echo sequence, or a gradient-echo sequence, such as a steady state free possession (SSFP), balanced stead state free precession (bSSFP) or spoiled gradient echo sequence, such as FLASH (Fast Low Angle SHot). It may also be an Echo Planar Imaging (EPI), Inversion Recovery or Diffusion-Weighted Imaging sequence. Usually, acquiring an MR-dataset of a collapsed image in each repetition will be performed by sampling the k-space, for example by Cartesian sampling, wherein k-space is sampled in several lines. A magnetic field gradient is applied along the frequency encoding direction while the signal is collected. To sample several lines, an additional phase-encoding gradient is briefly applied along a direction perpendicular to the frequency encoding direction, thereby imparting a position-dependent phase. A two-dimensional (2D) image (in k-space) is formed by repeating the processes of RF-excitation, phase-encoding, and frequency encoding many times, stepping through different values for the phase encoding gradient.

The desired spatial resolution and field-of-view (FOV) dictate how much k-space data should be acquired. The spacing between adjacent k-space lines is inversely related to the FOV:

$$FOV = 1/\Delta k \quad (3)$$

To increase the FOV along one direction, the spacing between sampled k-space points must decrease. If the FOV in phase encoding direction is smaller than the object which is imaged, the object will fold-in, an effect called aliasing. This is related to the Nyquist sampling theorem, according to which high-frequency signals will falsely appear as lower frequency signals if the sampling frequency is too low.

The spatial resolution is inversely proportional to the distance between the origin and the maximum extent of k-space (kmax).

$$\Delta x = \frac{1}{2} k\, max \quad (4)$$

Accordingly, to improve the spatial resolution, k-space points farther from the origin must be sampled.

Accordingly, scan time in magnetic resonance imaging may be reduced by sampling a smaller number of phase encoding lines in k-space; however, without further processing, the resulting images will be degraded by aliasing artifacts. Most MR-scanners use multichannel RF coils, i. e. RF-coils consisting of an array of multiple independent receiver coils. Since these multiple coils have different sensitivity profiles, it is possible to exploit this property of such coil arrays to separate aliased pixels in the image domain, or to estimate missing k-space data using knowledge of nearby acquired k-space points. These methods are generally called "parallel imaging", and are described for example in J. Hamilton at al.: "Recent Advances in Parallel Imaging for MRI", Prog. Nucl. Magn. Reson. Spectrosc; 101: 71-95 (2017), the entire contents of which are hereby incorporated herein by reference. If phase encoding lines are skipped at regular intervals, undersampling in phase encoding direction will decrease the effective FOV, resulting in coherent aliasing artifacts, where replicates of the object appear at regularly spaced intervals in the reduced FOV image. The amount of undersampling is described by the acceleration factor R, defined as the ratio between the number of k-space points in the fully-sampled data compared to the undersampled data. An acceleration factor of R leads to R image replica along phase encoding direction spaced from each other in a distance of FOV/R.

Herein, Parallel Imaging techniques are also referred to as "in-plane acceleration methods". According to an embodiment of the present invention, the MR-imaging sequence uses an in-plane parallel imaging technique, in particular, in-plane GRAPPA or in-plane SENSE. In SENSE (SENSitivity Encoding), aliased pixels are separated in the image domain, wherein in GRAPPA (GeneRAlized Partially Parallel Acquisitions), missing phase encoding lines are reconstructed in k-space.

According to one embodiment, when using parallel imaging techniques, the spatial registration is performed on the collapsed images including the image replica caused by aliasing. This embodiment is particularly useful, if the motion to be corrected mostly comprises in-plane translation, since the translation is also visible on the aliased images. Accordingly, the method steps b and c are performed on the MR-datasets of the collapsed images reconstructed from the uncorrected MR-datasets, i. e. from collapsed images reconstructed from the incomplete k-space. However, when reconstructing the individual slice images from the motion-corrected MR-datasets of the collapsed images, the missing k-space data points, called target points, are synthesized as a linear combination of acquired neighboring k-space points, called source-points. The spatial arrangement of source and target points is called the GRAPPA kernel. Each acquired source point is multiplied by a coefficient, or GRAPPA weight, and the results are added to estimate the target point. A single target point for one coil is reconstructed using source points from all other coils. For Cartesian acquisitions, the weights are shift-invariant to a first approximation, so the same GRAPPA weight can be applied throughout k-space. Therefore, in many GRAPPA techniques, GRAPPA requires extra data to estimate the GRAPPA weight set. In most embodiments, GRAPPA is considered to be auto-calibrating, because several additional phase encoding lines, called the auto-calibration signal, are collected near the k-space origin for calculating the weights. Then, the GRAPPA weight set can be determined and applied to the whole k-space. This synthetization of the missing k-space data point may be performed either before or after the MR datasets of the collapsed images are added/subtracted to disentangle the signals relating to the individual slices.

According to a further embodiment, when using in-plane parallel imaging, especially a method including undersampling in phase-encoding direction, the in-plane field view of the MR-image dataset in phase-encoding direction is larger than an object to be imaged. This is often the case, and may be easily arranged if the imaged object is for example a head or limb, which is imaged in roughly axial slices. In this case, the method is preferably adapted to comprise the steps: identifying segments of the field of view in phase encoding directions which do not include overlapping image replica, performing spatial registration between the identified segments of the field of view between at least two collapsed images and thereby obtaining translational and/or rotational correction parameters. This embodiment is especially advantageous, if valid rotational correction parameters have to be obtained, i. e. when a rotational motion may have taken place between the several repetitions. In this case, FOV segments or subsets are defined, which are limited in the spatial extend along phase-encoding direction. They are chosen, so that they do not include overlapping image replica, i. e. those segments are not affected by aliasing. If the object is at least a little smaller than the extension of the field of view in phase-encoding direction, there will be such segments.

In one alternative, the segments are determined automatically from the collapsed images. For example, a segmentation algorithm may identify the outer circumference of the imaged object, for each image replica, and may thereby determine the amount of overlap caused by aliasing. According to another embodiment, the segments of the FOV may be pre-determined. With an acceleration factor of 2 for example, the segments can be pre-determined to be (1) one segment/stripe in the center of the FOV of pre-determined wits w, and (2) one segment of wits w/2 at one end of the FOV, and (3) one segment of wits w/2 at the other end of the FOV.

According to an embodiment of the invention, motion correction may be performed prior to Hadamard/SMS imaging reconstruction by spatial registration of collapsed slices. This results in improved image quality, reduced artifact corruption of the final MR-images, and therefore fewer rescans, which may otherwise become necessary when the patient has moved during the image acquisition.

An embodiment of the invention is further directed to a magnetic resonance (MR) apparatus, comprising
 a) an MR scanner adapted to acquire MR datasets from a subject disposed inside the MR scanner, and
 b) a computer configured to emit control signals to the MR scanner in order to cause the MR scanner to perform the method according to any one of the preceding claims. The MR scanner may be any commercially available MR scanner, in particular a low-field scanner. The MR scanner includes all the usual equipment, in particular a main magnet, gradient coils as well as an RF coil for radiating RF excitation pulses and receiving MR signals. The RF coil may comprise a coil array. The MR scanner is connected to a computer configured to emitted control signals. The computer may be part of the console, from which the MR scanner is controlled. The computer may be any calculating device, such as a laptop, PC, workstation, cloud computer or mobile device.

An embodiment of the invention is further directed to a computer program product comprising programming instructions, which are adapted to be loaded into a computer of a MS apparatus that comprises an MR scanner, wherein the programming instructions cause the computer to carry out an embodiment of the inventive method.

According to a further embodiment of the invention, a non-transitory computer-readable data storage medium encoded with programming instructions adapted to be loaded into a computer of a magnetic resonance (MR) apparatus that comprises an MR scanner, the programming instructions causing the computer to carry out an embodiment of the inventive method in conjunction with the MR scanner by emitting control signals to the MR scanner and receiving data from the MR scanner. The storage medium may be in the cloud or may be any digital data storage medium, such as a CD-ROM, hard disc, SD-card, SSD-card, USB-card, etc.

FIG. 1 schematically shows an inventive magnetic resonance (MR) apparatus 1. The MR apparatus 1 has an MR data acquisition scanner 2 with a basic field magnet 3 that generates the constant magnetic field, a gradient coil arrangement 5 that generates the gradient fields, a radio-frequency antenna 7 for radiating and receiving radio-frequency signals, and a control computer 9 configured to perform the inventive method. In FIG. 1 such sub-units of the magnetic resonance apparatus 1 are only outlined schematically. The radio-frequency antenna 7 may be composed of multiple sub-units, in particular at least two coils, for example the schematically shown coils 7.1 and 7.2, which can be configured either only to transmit radio-frequency signals or only to receive the triggered radio frequency signals (MR signals), or to do both.

In order to acquire MR data from an examination object U, for example a patient or a phantom, the examination object U is introduced on a bed L into the measurement volume of the scanner. The slices S1 and S2 are examples of two different slices of the examination object, from which MR data can be acquired simultaneously. The control computer 9 centrally controls the magnetic resonance apparatus, and can control the gradient soil arrangement 5 with a gradient controller 5' and the radio-frequency antenna 7 with a radio-frequency transmit/receive controller 7'. The radio-frequency antenna 7 has multiple channels, in which signals can be transmitted or received. The radio-frequency antenna 7 together with its radio-frequency transmit/receive controller 7' is responsible for generating and radiating (transmitting) a radio-frequency alternating field for manipulating the nuclear spins in a region to be examined (in particular in different slices S1 and S2) of the examination object U. The center frequency of the radio-frequency alternating field, also referred to as the B1 field, here should be close to the resonance frequency of the nuclear spins to be manipulated. To generate the B1 field, currents controlled by the radio-frequency transmit/receive controller 7' are applied to the RF coils in the radio-frequency antenna 7. The control computer 9 also has a phase determination processor 15 that determines phases $\phi 1$ to be additionally assigned according to the invention. A computation processor 13 of the control computer 9 is configured to execute all the computation operations required for the required measurements and determinations.

Intermediate results and final results required for this purpose or determined in the process can be stored in a memory 17 of the control computer 9. The units shown here should not necessarily be considered as physically separate units, but simply represent a subdivision into functional units, which can also be implemented by fewer physical unit, or just one. A user can enter control commands into the magnetic resonance apparatus 1 and/or view displayed results, for example image data, from the control computer 9 via an input/output interface E/A. A non-transitory data storage medium 26 can be loaded into the control computer 9, and is encoded with programming instructions (program code) that cause the control computer 9, and the various functional units thereof described above, to implement any or all embodiments of the method according to the invention, as also described above.

Figure 2:
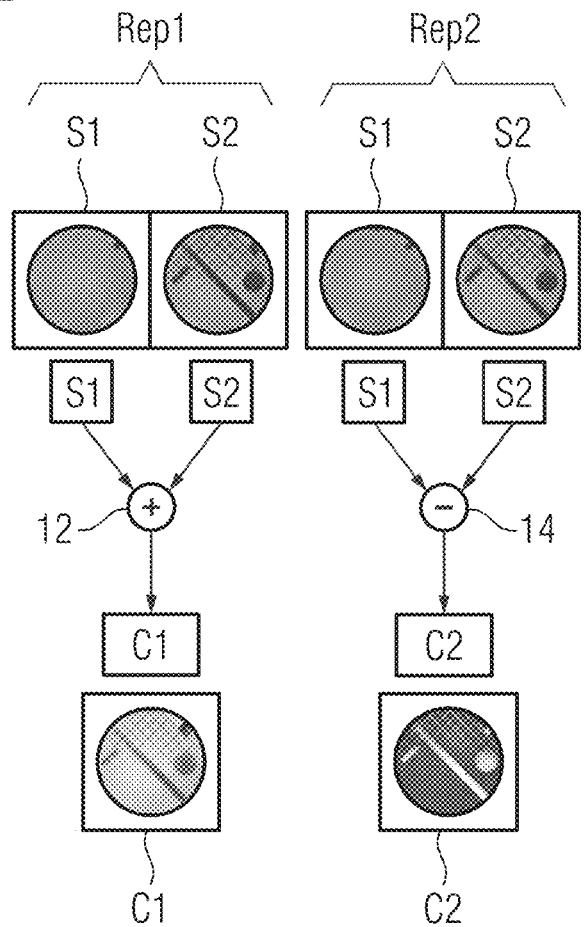
FIG. 2 is a schematic representation of the simultaneous acquisition of two slices with the Hadamard method.
Figure 3:
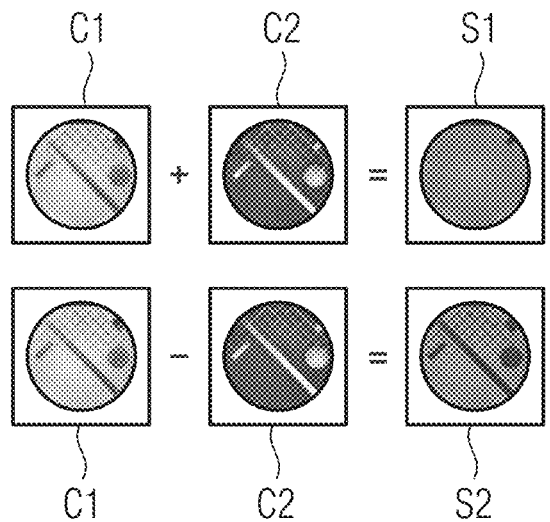
FIG. 3 is a schematic representation of the reconstruction of the individual slices with the Hadamard method.

FIG. 2 illustrates Hadamard encoding of two slices S1 and S2. Such encoding requires to repetitions, Rep1 and Rrep2. In the first repetition, single-band pulse shapes for slices 1 and 2 (S1, S2) are added. In a second repetition rep2, they are subtracted from one another, as indicated by 14. The subtraction from one another is realized by a 180° phase-shift of the excitation of the second slice, for example by allocating a respective phase-shift to the single-band pulse shape for S2 in the second repetition Rep2. The imaging in each repetition may be carried out by any MR imaging sequence, for example a Turbo Spin-Echo sequence. The sequence may comprise an in-plane acceleration technique, such as in-plane GRAPPA (also referred to as parallel imaging technique). Accordingly, the result of each repetition is a collapsed slice, i. e. an MR dataset relating to a 2D-image, which comprises image data from each slice S1, S2. In the first repetition, collapsed image C1 is acquired, and in the second repetition collapsed image C2. As can be seen, C1 is a superposition of the two slices S1 and S2, whereas C2 is an image, in which the signal intensities of S2 have been subtracted from the signal intensities of S1 for each pixel. The MR datasets relating to C1 and C2 are available in k-space, but may of course be transferred to image space (as depicted in FIG. 2). FIG. 3 shows how images of the individual slices S1, S2 can be reconstructed from the collapsed images. In particular, S1 can be retrieved by adding the two collapsed images C1 and C2, whereas the second slice S2 can be retrieved by subtracting C2 from C1. Please note that this has resulted in a doubling of the signal intensity and has therefore resulted in an increase in signal-to-noise ratio (SNR) of roughly $\sqrt{2}$, and which is particularly advantageous in low-field MR systems. Also for more than two slices, the individual slices can be retrieved by a Hadamard transform along the repetition dimension by adding and subtracting the respective simultaneously acquired collapsed images according to the Hadamard encoding scheme.

Because a slice can only be reconstructed from two repetitions, as evident from FIG. 3, the method is prone to patient motion, especially if long-term averaging has to be applied. A mismatch between the collapsed slices C1 and C2 will result in image artefacts. The same is true for the SMS approach described in U.S. Pat. No. 10,557,903 B2, even though the case of obtaining a common reference scan for both averages, performing individual reconstructions and averaging these will at least smear out motion artefacts.

Accordingly, an embodiment of the invention proposes motion correction to be performed in-between the repetitions to thereby incorporate a motion correction into the Hadamard/SMS averaging reconstruction chain. The idea is to perform a spatial registration of the collapsed slices C1, C2 between each acquired repetition Rep1, Rep2 prior to Hadamard/SMS reconstruction. In the illustrated embodiments, the method is described for Hadamard imaging; however, SMS imaging is also covered by an embodiment of the invention.

Figure 4:
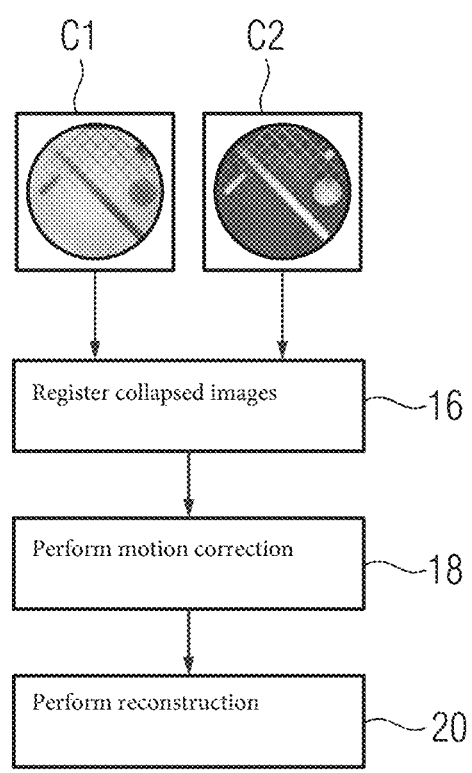
FIG. 4 is a flow diagram of an embodiment of the inventive method.

FIG. 4 is a simplified flow diagram of an embodiment of the inventive method. Accordingly, the method uses the two collapsed images C1, C2. In step 16, they are registered to obtain translational and/or rotational motion correction parameters, for example, a motion vector field in the most general case. The most straight forward embodiment is to correct for rigid-in plane motion only, the easiest variant comprising translation only. These effects may be corrected easily by translation/rotation in image space or multiplication with phase ramps/rotation in k-space. Since the primary application of Hadamard imaging is brain or joints imaging, this assumption is reasonable. In step 18 motion correction in image space/k-space is performed on one of the collapsed data sets, for example on the second collapsed image C2. The result is a corrected collapsed dataset C2'. Accordingly, in step 20, Hadamard reconstruction is performed on the corrected datasets according to FIG. 3, but in this example with datasets C1 and motion corrected dataset C2'.

Figure 5:
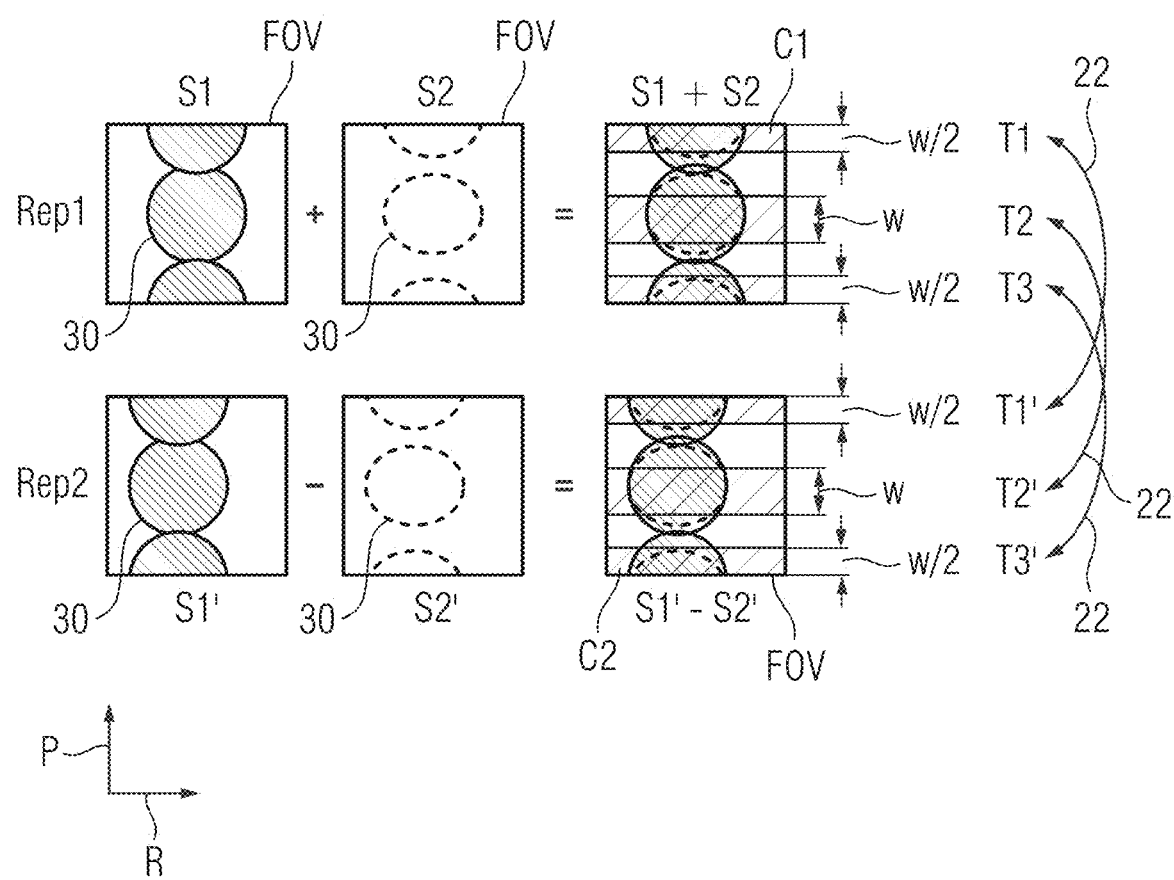
FIG. 5 is a schematic representation of an embodiment of the inventive method using Hadamard encoding in combination with in-plane GRAPPA with a GRAPPA factor of 2.

As shown in FIG. 5, the method can also be employed if a Hadamard/SMS imaging technique is combined with an in-plane acceleration method comprising undersampling in phase encoding direction P such as in-plane GRAPPA. A GRAPPA factor of R leads to R-image replica along phase encoding direction P in a distance of FOV/R. In the example of FIG. 5, R=2. In FIG. 5, the images of slices S1 and S2 are illustrated for two repetitions, Rep1, Rep2, as in FIG. 2. The in-plane phase encoding direction P is in the vertical, the read-direction is horizontal. The imaged object 30 might be a head, which is imaged in a roughly axial direction, and wherein the field of view FOV is somewhat bigger than the extension of the head 30. The head 30 has moved somewhat in-between the first and second repetitions, resulting in slices S1' and S2' in the second repetition Rep2, which do not fully match the images S1, S2 of the first repetition, i. e. the head 30 has moved in-between. Thus, also the collapsed images C1, C2 from each repetition do not fully correspond with one another, and a reconstruction according to Hadamard encoding would lead to considerable artefacts. If only translational movement had taken place between Rep1 and Rep2, valid correction factors could be obtained as described herein by rigid motion correction between C1 and C2. However, to obtain valid rotational correction parameters, it is advantageous to perform the motion registration only on those segments of the FOV, which are shaded in FIG. 5. These segments T1, T2, T3 are limited in their spatial extend along phase-encoding-direction P. They are situated around the centre and at the rim of the field view and having widths w at the centre and w/2 at the rim. Ideally, the width w is related to the ratio of the field of view in phase-encoding-direction and the maximum extent of the imaged object 30 and the acceleration factor R. At R=2, for example, if the object 30 covers 80% of the FOV in phase-encoding-direction, there will be a segment of 20% in the middle and 10% at the rims, which is free of aliasing artefacts, provided the object 30 is in the centre of the field of view. Thus, if the coverage of the field of view in P-direction is O=80%, then the maximum extension of the total field of view which may be used for motion correction is 2w=(1−O)×2, for R=2. Thus, the spatial registration between the collapsed images C1, C2 is performed only based on the shaded areas, i. e. T1 is registered with T1', T2 with T2', and T3 with T3' (indicated by arrow 22).

The best results are expected if the assumption of rigid motion and mainly in-plane motion is valid. Elastic motion correction may still be possible in situations in which the motion vector field in both simultaneously acquired slices is similar.

Figure 6:
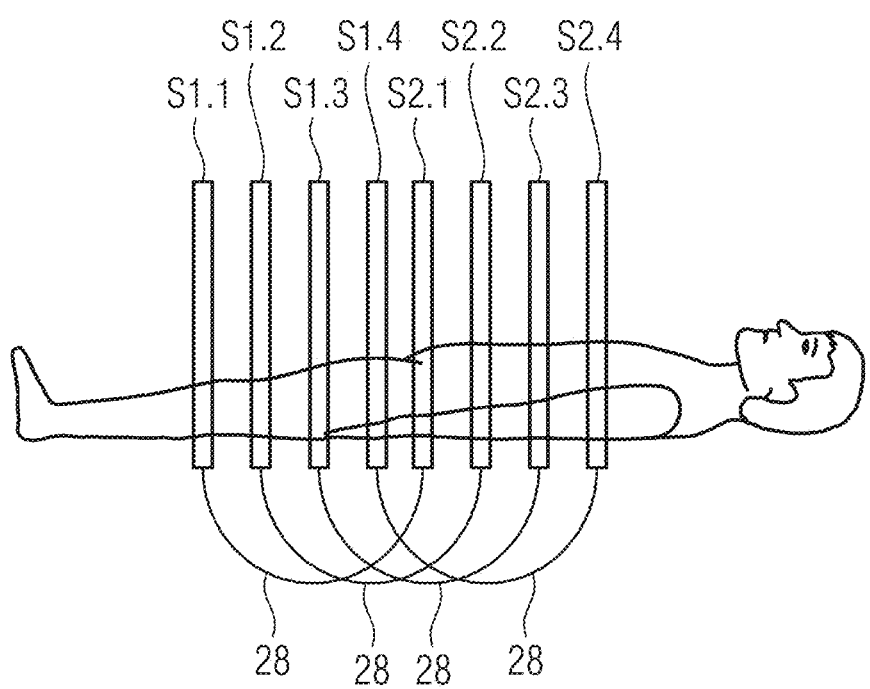
FIG. 6 is a schematic representation of a number of slices to be imaged with an embodiment of the inventive method

FIG. 6 illustrates an approach in which more than two images are acquired to cover a larger field of view in slice direction. In this case, 4 pairs of images are acquired one after the other, wherein slices S1.1 and S2.1 are acquired simultaneously (indicated by 28). Similarly, slices S1.2 and S2.2 as well as S1.3, S2.3 and S1.4, S2.4 are acquired simultaneously. As shown in FIG. 6, the pairs of slices are interleaved, so that the simultaneously acquired slices are not directly next to one another. This allows a more advanced implementation including through-plane motion correction. Thus, a motion registration is performed on all collapsed slice pairs SX.1, SX.2, SX.3 and SX.4 at the same time (e. g. after the acquisition has been completed). If it can be determined that motion has taken place, for example between the acquisition of SX.1 and SX.2, this may still be correctable, because the slices are next to one another. Thus, motion correction may be possible by signal interpolation between these collapsed slices.

Of course, the embodiments of the method according to the invention and the imaging apparatus according to the invention described here should be understood as being example. Therefore, individual embodiments may be expanded by features of other embodiments. In particular, the sequence of the method steps of the method according to the invention should be understood as being example. The individual steps can also be performed in a different order or overlap partially or completely in terms of time.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for acquiring a magnetic resonance (MR) image dataset of at least two slices via simultaneous multi-slice excitation, the method comprising:
   executing an MR imaging sequence using multi-band radio-frequency excitation pulses to excite the at least two slices simultaneously, wherein
   the MR imaging sequence includes at least two repetitions,
   the at least two repetitions are executed according to a phase modulation scheme, in which each excited slice of the at least two simultaneously excited slices is assigned a phase in each respective repetition of the at least two repetitions, to acquire a respective MR dataset of a respective collapsed image in each respective repetition,
   a phase of at least one of the at least two simultaneously excited slices is changed from one respective repetition to a next respective repetition,
   an undersampling factor in phase direction is given by an acceleration factor R, and
   at least one of at least two collapsed images includes an R image replica along a phase-encoding direction spaced from each other in a distance of an in-plane field of view divided by R;
   performing a spatial registration between the at least two collapsed images to obtain at least one of translational or rotational correction parameters, the spatial registration being performed on the at least two collapsed images including the R image replica caused by aliasing;
   performing motion correction on at least one of the MR datasets of the at least two collapsed images based on the at least one of translational or rotational correction parameters, to obtain corrected MR datasets; and
   reconstructing MR images of the at least two slices from the corrected MR datasets of the at least two collapsed images.

2. The method of claim 1, wherein the spatial registration is performed via a registration method which is insensitive to contrast changes.

3. The method of claim 2, wherein the spatial registration is performed via a mutual-information-based method.

4. The method of claim 2, wherein the spatial registration of the at least two collapsed images with one another is performed in image space.

5. The method of claim 2, wherein the performing of the motion correction includes at least one of a translation or a rotation in image space or a multiplication with at least one of phase ramps or a rotation in k-space.

6. The method of claim 2, wherein the performing of the motion correction includes performing rigid in-plane motion correction within a plane of one or more of the at least two slices.

7. The method of claim 2, wherein through-plane motion correction is performed by a motion registration of the at least two collapsed images acquired from different pairs of slices, and performing signal interpolation between the at least two collapsed images.

8. The method of claim 1, wherein the spatial registration of the at least two collapsed images with one another is performed in image space.

9. The method of claim 1, wherein the performing of the motion correction includes at least one of a translation or a rotation in image space or a multiplication with at least one of phase ramps or a rotation in k-space.

10. The method of claim 1, wherein the performing of the motion correction includes performing rigid in-plane motion correction within a plane of one or more of the at least two slices.

11. The method of claim 1, wherein through-plane motion correction is performed by a motion registration of the at least two collapsed images acquired from different pairs of slices, and performing signal interpolation between the at least two collapsed images.

12. The method of claim 1, wherein the multi-band radio-frequency excitation pulses each includes a first and a second single-band pulse shape, wherein at least one single-band pulse shape is phase shifted between one repetition and a next repetition.

13. The method of claim 12, wherein phases assigned to the at least two simultaneously excited slices are varied from one repetition to a next repetition by switching additional gradients in slice direction.

14. The method of claim 13, wherein a phase modulation scheme of the simultaneous multi-slice excitation uses Hadamard-encoding.

15. The method of claim 1, wherein the MR imaging sequence uses an in-plane acceleration method.

16. The method of claim 15, wherein the in-plane acceleration method is an in-plane GRAPPA or in-plane SENSE technique.

17. The method of claim 1, wherein phases assigned to the at least two simultaneously excited slices are varied from one repetition to a next repetition by switching additional gradients in slice direction.

18. The method of claim 1, wherein a phase modulation scheme of the simultaneous multi-slice excitation uses Hadamard-encoding.

19. A non-transitory computer-readable data storage medium encoded with programming instructions, adapted to be loaded into a computer of a magnetic resonance apparatus comprising an MR scanner, the programming instructions, when executed, causing the computer to carry out the method of claim 1 in conjunction with the MR scanner by emitting control signals to the MR scanner and receiving data from the MR scanner.

20. A magnetic resonance apparatus, comprising:
an MR scanner adapted to acquire MR datasets from a subject disposed inside the MR scanner; and
a computer configured to emit control signals to the MR scanner to cause the MR scanner to:
execute an MR imaging sequence using multi-band radio-frequency excitation pulses to excite the at least two slices simultaneously, wherein
the MR imaging sequence includes at least two repetitions,
the at least two repetitions are executed according to a phase modulation scheme, in which each excited slice of the at least two simultaneously excited slices is assigned a phase in each respective repetition of the at least two repetitions, to acquire a respective MR dataset of a respective collapsed image in each respective repetition,
a phase of at least one of the at least two simultaneously excited slices is changed from one respective repetition to a next respective repetition,
an undersampling factor in phase direction is given by an acceleration factor R, and
at least one of at least two collapsed images includes an R image replica along a phase-encoding direction spaced from each other in a distance of an in-plane field of view divided by R,
perform a spatial registration between the at least two collapsed images to obtain at least one of translational or rotational correction parameters, the spatial registration being performed on the at least two collapsed images including the R image replica caused by aliasing,
perform motion correction on at least one of the MR datasets of the at least two collapsed images based on the at least one of translational or rotational correction parameters, to obtain corrected MR datasets, and
reconstruct MR images of the at least two slices from the corrected MR datasets of the at least two collapsed images.

21. A method for acquiring a magnetic resonance (MR) image dataset of at least two slices via simultaneous multi-slice excitation, the method comprising:
executing an MR imaging sequence using multi-band radio-frequency excitation pulses to excite the at least two slices simultaneously, wherein
the MR imaging sequence includes at least two repetitions,
the at least two repetitions are executed according to a phase modulation scheme, in which each excited slice of the at least two simultaneously excited slices is assigned a phase in each respective repetition of the at least two repetitions, to acquire a respective MR dataset of a respective collapsed image in each respective repetition,
a phase of at least one of the at least two simultaneously excited slices is changed from one respective repetition to a next respective repetition,
an undersampling factor in phase direction is given by an acceleration factor R,
at least one of at least two collapsed images includes an R image replica along a phase-encoding direction spaced from each other in a distance of an in-plane field of view divided by R, and
the in-plane field of view of the MR dataset in the phase-encoding direction is relatively larger than an object to be imaged;
identifying segments of a field of view of the at least two collapsed images in the phase encoding direction which do not include overlapping image replica;
performing a spatial registration between the segments of the field of view identified of the at least two collapsed images to obtain the at least one of translational or rotational correction parameters;
performing motion correction on at least one of the MR datasets of the at least two collapsed images based on the at least one of translational or rotational correction parameters, to obtain corrected MR datasets; and
reconstructing MR images of the at least two slices from the corrected MR datasets of the at least two collapsed images.

22. A magnetic resonance apparatus, comprising:
an MR scanner adapted to acquire MR datasets from a subject disposed inside the MR scanner; and
a computer configured to emit control signals to the MR scanner to cause the MR scanner to
execute an MR imaging sequence using multi-band radio-frequency excitation pulses to excite the at least two slices simultaneously, wherein
the MR imaging sequence includes at least two repetitions,
the at least two repetitions are executed according to a phase modulation scheme, in which each excited slice of the at least two simultaneously excited slices is assigned a phase in each respective repetition of the at least two repetitions, to acquire a respective MR dataset of a respective collapsed image in each respective repetition, a phase of at least one of the at least two simultaneously excited slices is changed from one respective repetition to a next respective repetition, an undersampling factor in phase direction is given by an acceleration factor R, and at least one of at least two collapsed images includes an R image replica along a phase-encoding direction spaced from each other in a distance of an in-plane field of view divided by R, identify segments of a field of view of the at least two collapsed images in the phase encoding direction which do not include overlapping image replica, perform a spatial registration between the segments of the field of view identified of the at least two collapsed images to obtain the at least one of translational or rotational correction parameters, perform motion correction on at least one of the MR datasets of the at least two collapsed images based on the at least one of translational or rotational correction parameters, to obtain corrected MR datasets, and reconstruct MR images of the at least two slices from the corrected MR datasets of the at least two collapsed images.

\* \* \* \* \*